(12) United States Patent
Smith

(10) Patent No.: US 6,825,674 B2
(45) Date of Patent: Nov. 30, 2004

(54) MICROWAVE HOLOGRAPHIC MEASURING METHOD AND APPARATUS

(75) Inventor: David Smith, Lanchester (GB)

(73) Assignee: University of Northumbria at Newcastle, Newcastle Upon Tyne (GB)

( * ) Notice: Subject to any disclaimer, the term of this patent is extended or adjusted under 35 U.S.C. 154(b) by 0 days.

(21) Appl. No.: 10/380,562

(22) PCT Filed: Sep. 11, 2001

(86) PCT No.: PCT/GB01/04060
§ 371 (c)(1),
(2), (4) Date: Jul. 22, 2003

(87) PCT Pub. No.: WO02/23205
PCT Pub. Date: Mar. 21, 2002

(65) Prior Publication Data
US 2004/0004568 A1 Jan. 8, 2004

(30) Foreign Application Priority Data
Sep. 13, 2000 (GB) .............................. 0022503

(51) Int. Cl.$^7$ .............................................. G01R 27/04
(52) U.S. Cl. ..................................... 324/637; 324/638
(58) Field of Search ................................ 324/637, 638, 324/639, 640; 342/188; 343/700 R

(56) References Cited

U.S. PATENT DOCUMENTS

| | | | | |
|---|---|---|---|---|
| 4,118,668 A | * | 10/1978 | Strayer, Jr. ................ | 455/67.16 |
| 4,754,496 A | * | 6/1988 | Fishkin et al. ........... | 455/67.15 |
| 4,884,078 A | * | 11/1989 | Fishkin et al. ............... | 342/360 |
| 4,887,313 A | * | 12/1989 | Luke et al. .................... | 398/11 |
| 4,932,075 A | * | 6/1990 | Dimitrijevic et al. ..... | 455/226.1 |
| 5,396,255 A | * | 3/1995 | Durkota et al. ............. | 342/360 |
| 5,841,288 A | * | 11/1998 | Meaney et al. ............. | 324/639 |
| 6,097,189 A | * | 8/2000 | Arndt et al. ................ | 324/326 |
| 6,771,216 B2 | * | 8/2004 | Patel et al. ................. | 342/368 |

* cited by examiner

Primary Examiner—Anjan Deb
Assistant Examiner—Walter Benson
(74) Attorney, Agent, or Firm—Zilka-Kotab, PC

(57) ABSTRACT

A microwave holographic measuring method is disclosed. A first electrical signal S of microwave frequency is provided. A first part S1 of the first signal S is directed to a first antenna (101). Predetermined changes of phase and amplitude are applied to a second part S2 of the first signal S to produce a second electrical signal S4 which is coherent with the first part S1 of the first signal S. Microwave radiation is detected at a plurality of locations by means of a second antenna (107) to generate a third electrical signal S5 at each location. The second S4 and third S5 electrical signals are combined to produce a fourth electrical signal.

14 Claims, 3 Drawing Sheets

Microwave Holography by Sampling Intensity Patterns

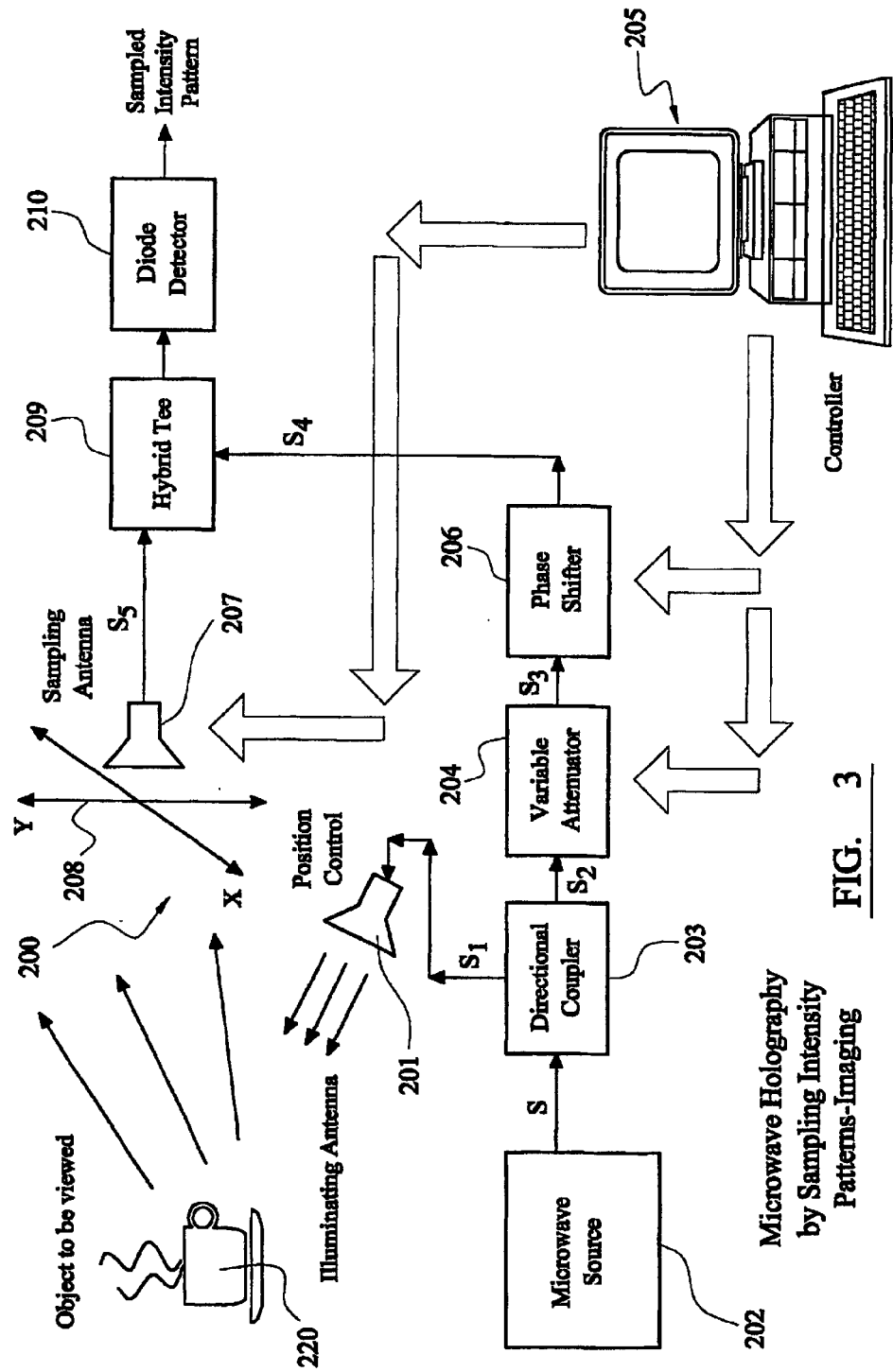

MICROWAVE HOLOGRAPHIC MEASURING METHOD AND APPARATUS

The present application claims the priority of a United Kingdom patent filed 09/13/2000 under application No. 0022503.7.

The present invention relates to a microwave holographic measuring method and apparatus, and relates particularly, but not exclusively, to such method and apparatus for testing a microwave antenna or forming an image of an object.

Methods of testing microwave antennas by microwave holography are known and an arrangement for carrying out such a method is shown in FIG. 1. A signal from a network analyser 1 causes an antenna 2 under test to emit microwave radiation, which is sampled at suitable intervals over an appropriate aperture by means of a sampling antenna 3 which can be moved along the axes X and Y shown in the figure. The output signal from the sampling antenna 3 is returned to the network analyser. At each sampling position, the signal radiated from the antenna 2 under test is fed to the network analyser 1, which determines the relative amplitude and phase of the return signal by comparison with the output signal of the network analyser. These values of amplitude and phase at each scanning position are recorded, and can be Fourier transformed to produce patterns of antenna radiation.

However, this known method suffers from the drawback that the cost of the network analyser is very high, and the network analysers are restricted in frequency, as a result of which the range of applications of the method is fairly limited.

Preferred embodiments of the present invention seek to overcome the above disadvantages of the prior art.

According to an aspect of the present invention, there is provided a microwave holographic measuring method comprising:

providing a first electrical signal of at least one microwave frequency;

directing a first part of said first signal to a first antenna;

applying predetermined changes of phase and amplitude to a second part of said first signal to produce a second electrical signal, wherein said second part is coherent with said first part;

detecting microwave radiation at a plurality of locations by means of a second antenna to generate a respective third electrical signal at each said location; and combining said second and third signals to produce a fourth electrical signal.

By applying predetermined changes of phase and amplitude to part of the first electrical signal, this provides the advantage that the second electrical signal can reproduce the behaviour of reference microwave radiation which would interfere with the radiation emitted by the antenna under test, i.e. by electrically imitating the behaviour of interfering microwave radiation. As a result, a hologram of the radiation pattern observed at the sampling antenna can be produced, which avoids the necessity for a network analyser. This reduces the cost of equipment for carrying out the method, and also enables the apparatus to operate over a wider range of frequencies or even simultaneous operation at multiple frequencies, which in turn broadens the range of applications of the method. The invention also has the advantage that by electrically imitating the behaviour of interfering microwave radiation, this under some circumstances permits the electrical synthesis of reference microwave radiation which cannot be produced in the form of microwaves.

The predetermined changes of phase and amplitude may be chosen to reproduce a predetermined microwave signal at each said location.

The method may be a method of measuring radiation characteristics of the first antenna.

The method may further comprise the step of comparing values of said fourth electrical signal with corresponding values of the fourth electrical signal for an antenna of known characteristics.

This provides the advantage of enabling the properties of antennae to be tested by comparing unprocessed image holographic data, as opposed to processed data, thus offering savings in efficiency.

In a preferred embodiment, the method is a method of forming a microwave image of an object, and further comprises the step of illuminating the object with said first part.

In a preferred embodiment, the predetermined changes of phase and amplitude are chosen to reproduce a predetermined microwave signal at each said location.

The method preferably further comprises the step of combining said fourth signal with a signal representing predetermined microwave radiation to generate holographic image data for each said location.

The method may further comprise the step of applying predetermined changes of phase and amplitude to said fourth electrical signal to produce a fifth electrical signal, wherein said fifth electrical signal represents a microwave image of the object.

The method may further comprise the step of processing said fourth electrical signal to generate data representing an image of the object at locations other than said plurality of locations.

The method may be a method of detecting buried objects.

According to another aspect of the present invention, there is provided a microwave holographic measuring apparatus comprising:

signal generator means for generating a first electrical signal of at least one microwave frequency;

coupler means for directing a first part of said first signal to an antenna and providing a second part of said first signal, wherein said second part is coherent with said first part;

phase/amplitude adjusting means for applying predetermined changes of phase and amplitude to said second part to produce a second electrical signal;

at least one first antenna for detecting microwave radiation at a plurality of locations to generate a respective third electrical signal at each said location; and combining means for combining said second and third signals to produce a fourth electrical signal.

The apparatus may further comprise at least one second antenna for receiving said first part of said first signal and illuminating an object.

The apparatus may further comprise detector means for detecting said fourth signals.

The apparatus preferably further comprises position adjusting means for adjusting the position of the or each said second antenna.

The apparatus may further comprise controller means for controlling said phase/amplitude adjusting means.

Preferred embodiments of the invention will now be described, by way of example only and not in any limitative sense, with reference to the accompanying drawings, in which:-

FIG. 3 is a schematic view of a microwave imaging apparatus embodying the present invention.

Figure 1:
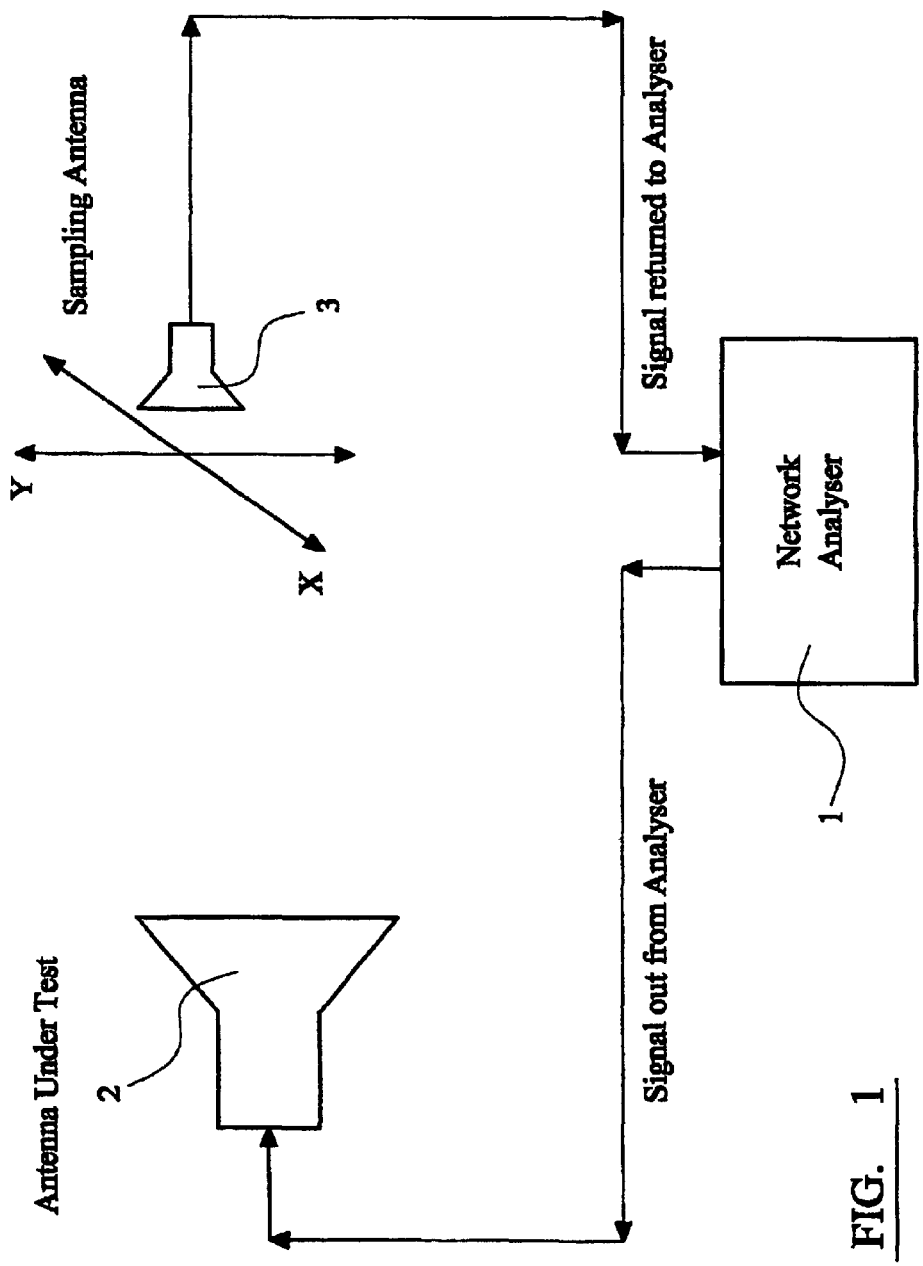
FIG. 1 is a schematic view of a prior art antenna testing apparatus.
Figure 2:
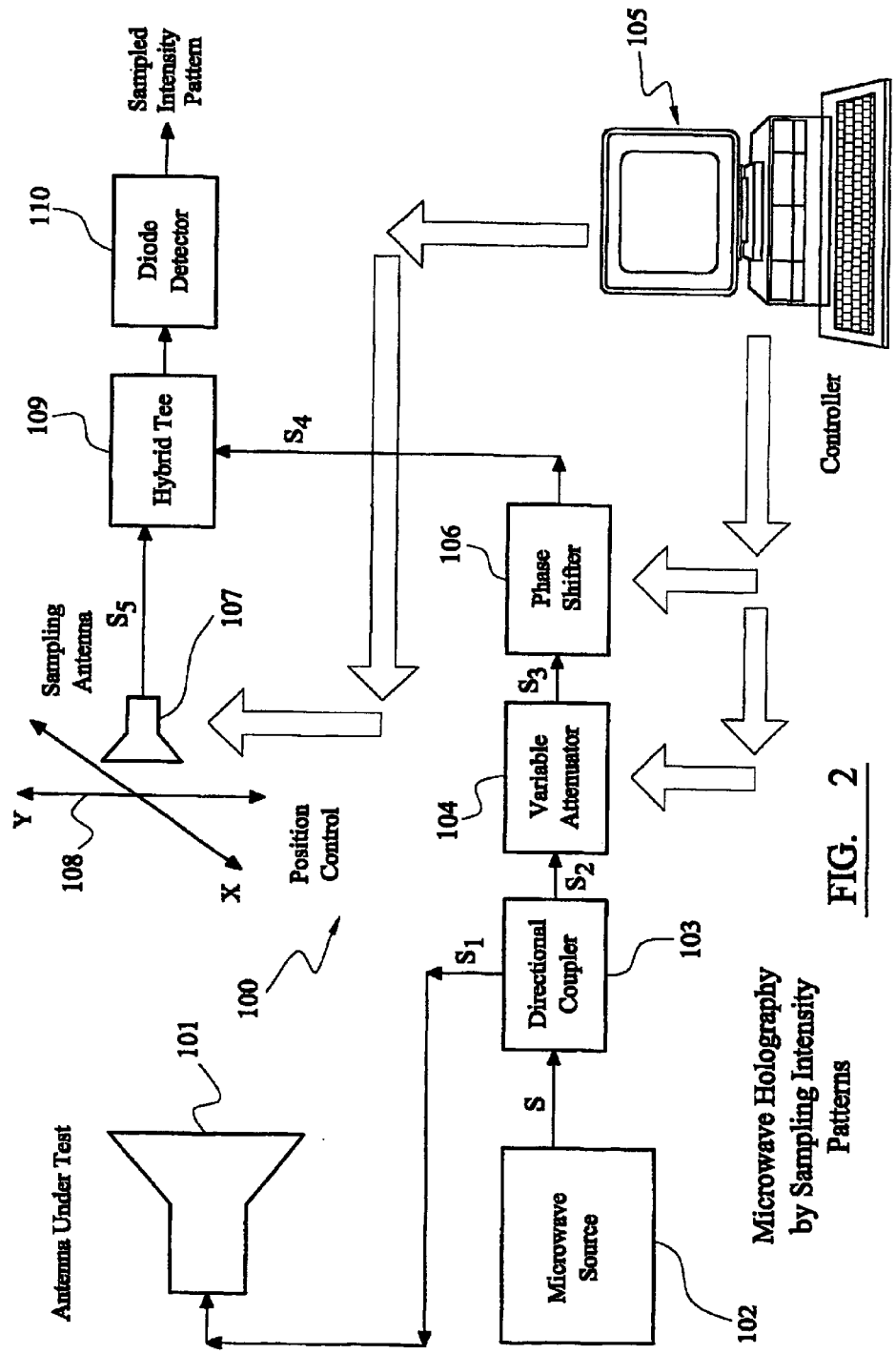
FIG. 2 is a schematic view of an antenna testing apparatus embodying the present invention.

Referring to FIG. 2, an apparatus 100 for measuring the radiation characteristics of an antenna 101 (or for determining any faults in antenna 101) has a microwave source 102 for producing an electrical signal of one or more microwave frequencies. The signal S from microwave source 102 is fed to a directional coupler 103 or other signal splitting device which directs signal S1, part of signal S, to the antenna 101 under test, and a signal S2, also part of signal S and coherent with signal S1, to a variable attenuator 104. The variable attenuator 104 is controlled by a computer 105 and alters the amplitude of signal S2 to produce signal S3. Signal S3 is fed to a phase shifter 106, also controlled by computer 105, for adjusting the phase of signal S3 to produce signal S4.

A sampling antenna 107 is mounted to a position controller 108, which can move the antenna 107 along the axes X and Y and which is also controlled by computer 105. It will be appreciated by persons skilled in the art that the sampling antenna 107 can also be moved in the Z-direction, for example for carrying out object imaging applications. The sampling antenna 107 detects the microwave radiation from the antenna 101 under test at various positions to which it is moved by the position controller 108, and the detected radiation signal S5 is passed to a mixing device such as a hybrid tee 109, to which the signal S4 is also fed. The signals S5 and S4 interfere with each other in the hybrid tee 109 to produce an intensity pattern which is detected by diode detector 110 to output a sampled intensity pattern.

The operation of the apparatus shown in FIG. 2 will now be described.

The signal S4 input to the hybrid tee 109 has selected amplitude variations applied to it via variable attenuator 104 and phase changes applied by phase shifter 106, both of which are under the control of computer 105. Because the signals S4 and S5 are coherent with each other, the signals interfere with each other in hybrid tee 109 and a sampled intensity pattern is output from diode detector 110.

The amplitude and phase changes applied by variable attenuator 104 and phase shifter 106 can be chosen by computer 105 to reproduce a predetermined wave at the position of sampling antenna 107, for example a plane wave, with the result that the signal output from hybrid tee 109 represents the output of antenna 101 under test interfered with a coherent reference wave. A second example of the predetermined wave that can be simulated is a spherical wave, for example when the focus of a spherical reference wave is located in the plane of the antenna under test, which would otherwise prevent a spherical reference wave from being used because of the problem of two antennae being in the same position. In other words, the sampled intensity pattern output from diode detector 110 represents a hologram of the output of antenna 101. By application of Fourier transforms and/or inverse Fourier transforms and filtering to the sampled intensity pattern, antenna far-field radiation patterns for the antenna 101 can be produced.

Referring now to FIG. 3, in which parts common to the embodiment of FIG. 2 are denoted by like reference numerals but increased by 100, an apparatus 200 for forming a microwave holographic image of an object 220 uses antenna 201 to illuminate object 220 with a microwave beam derived from signal S1. The beam reflected by object 220 is detected at various locations by sampling antenna 207 to produce signal S5 which is then combined with signal S4 in hybrid tee 209. In a manner similar to the embodiment of FIG. 2, a sampled intensity pattern is output by diode detector 210.and because the phase and amplitude variations applied to signal S4 represent a reference beam coherent with signal S1, the sampled intensity pattern forms a hologram of the object 220. The sampled intensity pattern can be subject to Fourier transformation and, if appropriate, inverse Fourier transformation and filtering to produce a plane wave spectrum of the object 220, and by means of manipulation by inverse Fourier transforms, a microwave image of the object can be obtained.

The hologram produced by the method of the present invention can be processed by means of mathematical algorithms which will be known to persons skilled in the art to produce data representing the image of an object at locations other than the locations at which sampling measurements are made. One application of this feature is the detection of buried objects, such as landmines. For example, a microwave emitter and an array of detectors are arranged above an area of ground which is known to be free of landmines, for example because it has been cleared. The microwaves received at the detectors consist of high intensity signals representing microwaves from the emitter reflected from the surface of the ground, and lower intensity signals representing microwaves reflected by objects buried under the ground. Phase and amplitude changes are then applied to the apparatus so that the detectors have zero output in the case of the area of ground free of mines, so that when the same microwave input radiation is applied to a similar piece of ground, the reflection of microwaves by buried landmines will cause one of more of the detectors to emit a non-zero output.

It will be appreciated by persons skilled in the art that the above embodiments have been described by way of example only and not in any limitative sense, and that various alterations and modifications are possible without departure from the scope of the invention as defined by the appended claims.

What is claimed is:

1. A microwave holographic measuring method comprising:

providing a first electrical signal of at least one microwave frequency;

directing a first part of said first signal to a first antenna;

applying predetermined changes of phase and amplitude to a second part of said first signal to produce a second electrical signal, wherein said second part is coherent with said first part;

detecting microwave radiation at a plurality of locations using a second antenna to generate a respective third electrical signal at each said location; and combining said second and third signals to produce a fourth electrical signal.

2. A method according to claim 1, wherein the predetermined changes of phase and amplitude are chosen to reproduce a predetermined microwave signal at each said location.

3. A method according to claim 1, wherein the method is a method of measuring radiation characteristics of the first antenna.

4. A method according to claim 3, further comprising comparing values of said fourth electrical signal with corresponding values of the fourth electrical signal for an antenna of known characteristics.

5. A method according to claim 1, wherein the method is a method of forming a microwave image of an object, and further comprises illuminating the object with said first part.

6. A method according to claim 5, further comprising combining said fourth signal with a signal representing predetermined microwave radiation to generate holographic image data for each said location.

7. A method according to claim 5, further comprising applying predetermined changes of phase and amplitude to said fourth electrical signal to produce a fifth electrical signal, wherein said fifth electrical signal represents a microwave image of the object.

8. A method according to claim 5, further comprising processing said fourth electrical signal to generate data representing an image of the object at locations other than said plurality of locations.

9. A method according to claim 8, wherein the method is a method of detecting buried objects.

10. A microwave holographic measuring apparatus comprising:

- at least one signal generator device for generating a first electrical signal of at least one microwave frequency;
- at least one coupler device for directing a first part of said first signal to an antenna and providing a second part of said first signal, wherein said second part is coherent with said first part;
- at least one phase/amplitude adjusting device for applying predetermined changes of phase and amplitude to said second part to produce a second electrical signal;
- at least one first antenna for detecting microwave radiation at a plurality of locations to generate a respective third electrical signal at each said location; and
- at least one combining device for combining said second and third signals to produce a fourth electrical signal.

11. An apparatus according to claim 10, further comprising at least one second antenna for receiving said first part of said first signal and illuminating an object.

12. An apparatus according to claim 10, further comprising at least one detector device for detecting said fourth signals.

13. An apparatus according to claim 10, further comprising at least one position adjusting device for adjusting the position of the or each said second antenna.

14. An apparatus according to claim 10, further comprising at least one controller device for controlling each said phase/amplitude adjusting device.

* * * * *